(12) United States Patent
Liew et al.

(10) Patent No.: US 10,892,182 B2
(45) Date of Patent: Jan. 12, 2021

(54) RELATING TO SEMICONDUCTOR DEVICES

(71) Applicants: Foo Sen Liew, Sarawak (MY); Jee Chang Lai, Sarawak (MY)

(72) Inventors: Foo Sen Liew, Sarawak (MY); Jee Chang Lai, Sarawak (MY)

(73) Assignee: X-FAB SARAWAK SDN. BHD., Sarawak (MY)

(*) Notice: Subject to any disclaimer, the term of this patent is extended or adjusted under 35 U.S.C. 154(b) by 51 days.

(21) Appl. No.: 16/418,525

(22) Filed: May 21, 2019

(65) Prior Publication Data
US 2019/0355614 A1 Nov. 21, 2019

(30) Foreign Application Priority Data
May 21, 2018 (GB) .................................. 1808291.7

(51) Int. Cl.
H01L 21/762 (2006.01)
H01L 21/02 (2006.01)
H01L 21/8234 (2006.01)
H01L 21/3105 (2006.01)
H01L 21/311 (2006.01)
H01L 21/266 (2006.01)
H01L 21/033 (2006.01)

(52) U.S. Cl.
CPC .... H01L 21/76224 (2013.01); H01L 21/0217 (2013.01); H01L 21/02164 (2013.01); H01L 21/02236 (2013.01); H01L 21/0332 (2013.01); H01L 21/266 (2013.01); H01L 21/31053 (2013.01); H01L 21/31111 (2013.01); H01L 21/823481 (2013.01)

(58) Field of Classification Search
None
See application file for complete search history.

(56) References Cited

U.S. PATENT DOCUMENTS

| 5,502,009 A | 3/1996 | Lin | |
| 5,716,863 A * | 2/1998 | Arai | H01L 21/28061 148/DIG. 163 |
| 5,953,599 A * | 9/1999 | El-Diwany | H01L 21/8238 438/199 |

(Continued)

FOREIGN PATENT DOCUMENTS

EP 2525396 11/2012

OTHER PUBLICATIONS

U.S. Non-Final Office Action, U.S. Appl. No. 16/418,569, 14 pages (dated Apr. 2, 2020).

(Continued)

Primary Examiner — Nilufa Rahim
(74) Attorney, Agent, or Firm — Thompson Hine LLP

(57) ABSTRACT

A method of fabricating a semiconductor device with Shallow Trench Isolation (STI) includes performing the following steps in the following sequence: providing a substrate comprising first and second gate regions separated by a trench formed in the substrate, wherein the trench is filled with an STI material. The method further includes depositing a sacrificial polysilicon layer covering the STI material; growing a thick oxide layer on the first and second gate regions; removing the thick oxide layer from the first gate region while leaving the thick oxide layer in the second gate region.

20 Claims, 5 Drawing Sheets

(56) References Cited

U.S. PATENT DOCUMENTS

| | | | |
|---|---|---|---|
| 6,033,958 | A | 3/2000 | Chou |
| 6,225,163 | B1 | 5/2001 | Bergemont |
| 6,235,591 | B1 | 5/2001 | Balasubramanian et al. |
| 6,335,556 | B1 | 1/2002 | Kitazawa et al. |
| 6,410,387 | B1* | 6/2002 | Cappelletti ........... H01L 27/105 257/E21.689 |
| 2003/0022460 | A1 | 1/2003 | Park |
| 2004/0147137 | A1 | 7/2004 | Hiraiwa et al. |
| 2005/0085042 | A1 | 4/2005 | Chun et al. |
| 2005/0277238 | A1 | 12/2005 | Doumae |
| 2007/0243692 | A1* | 10/2007 | Rudeck ............. H01L 21/76232 438/400 |
| 2008/0160736 | A1* | 7/2008 | Alshareef ....... H01L 21/823857 438/585 |
| 2009/0243030 | A1 | 10/2009 | Shih |
| 2010/0164004 | A1* | 7/2010 | Chatterjee ....... H01L 21/823878 257/369 |
| 2012/0306001 | A1 | 12/2012 | Hirano |
| 2013/0082318 | A1 | 4/2013 | Liu et al. |

OTHER PUBLICATIONS

U.S. Final Office Action, U.S. Appl. No. 16/418,569, 14 pages (dated Aug. 24, 2020).
GB, Combined Search and Examination Report, GB Application No. 1808291.7 (dated Aug. 29, 2018).
GB, Combined Search and Examination Report, GB Application No. 1808290.9 (dated Aug. 15, 2018).

* cited by examiner

RELATING TO SEMICONDUCTOR DEVICES

This application claims priority to GB Application No. 1808291.7 filed on May 21, 2018, the entire contents of which are hereby incorporated by reference.

FIELD

The invention pertains generally to the field of semiconductor device manufacturing.

BACKGROUND

In the more challenging types of System-on-Chip (SoC) solutions, the circuit can demand the integration of logic, mixed-signal, analog, non-volatile memory (NVM), High Voltage (HV) and Deep Trench Isolation (DTI) parts.

The integration of each part can require multiple implant steps to construct; this can lead to an increased cleaning step due to an increase in the use of photomask coating in the device construction. The cleaning step can cause an excessive loss of Shallow Trench Isolation (STI) oxide during Front End of Line (FEOL) (being the first steps in the fabrication process), thus causing the sharp gate/poly edges [E] shown in FIG. 3. Due to this challenge, and a high STI field step height [A] (shown in FIG. 1) used at the beginning of the process, problems are caused including process defect issues, reduced etch process margins, reduced patterning margins, and an unbalanced well profile between the STI region and the active region.

Referring to FIGS. 1 to 3, other challenges due to excessive STI oxide loss during FEOL include:

Excessive STI divot (i.e. recess) [B] causing undesirable transistor behavior, STI edge related leakage, dislocation, and process defect issues.

Excessive STI field oxide loss causing reduced STI depth [D] at thin gate oxide region causing lower isolation breakdown and higher diode junction leakage.

Sharp Gate/Poly edges [E] causing reduced reliability lifetime.

SUMMARY

In one embodiment the invention provides semiconductor devices with Shallow Trench Isolation and methods of fabricating such, as set out in the accompanying claims. In one case, the invention is a method of fabricating a semiconductor device with Shallow Trench Isolation (STI), the method including performing the following steps in the following order: providing a substrate including first and second gate regions separated by a trench formed in the substrate, wherein the trench is filled with an STI material. The method can further include depositing a sacrificial polysilicon layer covering and in direct contact with the STI material; growing a thick oxide layer directly on the substrate in the first and second gate regions, whilst growing the thick oxide layer, oxidizing the sacrificial polysilicon layer to form an oxidized sacrificial polysilicon layer; removing the thick oxide layer from the first gate region to expose the substrate in the first region while leaving the thick oxide layer in the second gate region, wherein the step of removing the thick oxide layer also comprises removing the oxidized sacrificial polysilicon layer so as to at least partly expose the STI material.

Certain embodiments will now be described, by way of example only, with reference to the accompanying figures.

BRIEF DESCRIPTION OF THE FIGURES

FIG. 1 is shown after STI Chemical Mechanical Polishing (CMP) and oxide etches to achieve the required STI field step height [A] for subsequent processing;

DETAILED DESCRIPTION

We now describe a method which can prevent excessive Shallow Trench Isolation (STI) oxide loss during Front End of Line (FEOL). The method uses sacrificial polysilicon capping during FEOL.

The steps of the method may include providing a silicon substrate; depositing sacrificial polysilicon (sometimes hereinafter referred to simply as "poly") on the planarized STI High Density Plasma (HDP) Oxide; planarizing (e.g. polishing) the sacrificial poly and stopping at a SiN hardmask; removing the SiN hardmask; using the sacrificial poly to cap the STI oxide during the process, oxidizing the sacrificial poly during the growth of a gate oxide layer; and removing oxidized sacrificial poly during a thick gate oxide wet etch step.

The method enables a robust integration of the different parts during semiconductor device fabrication. The method also fulfils a requirement of STI step height, and prevents oxide loss at the STI field region.

Figure 1:
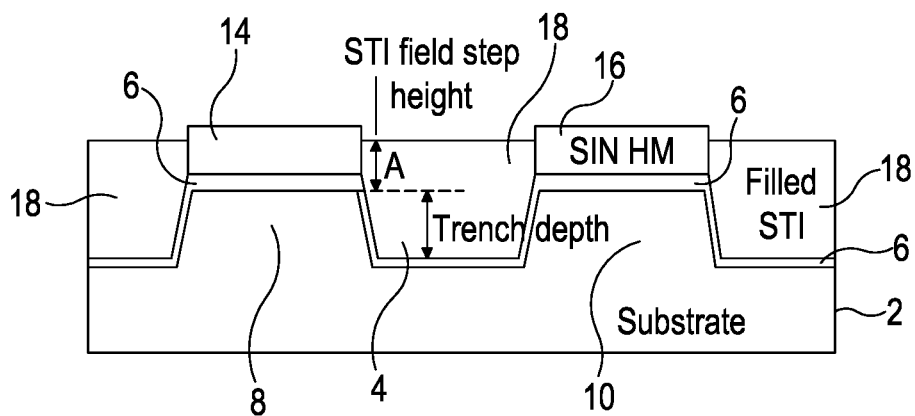
FIG. 1 shows a prior art method in which a thick oxide layer is grown before creating a thin oxide layer.
Figure 2:
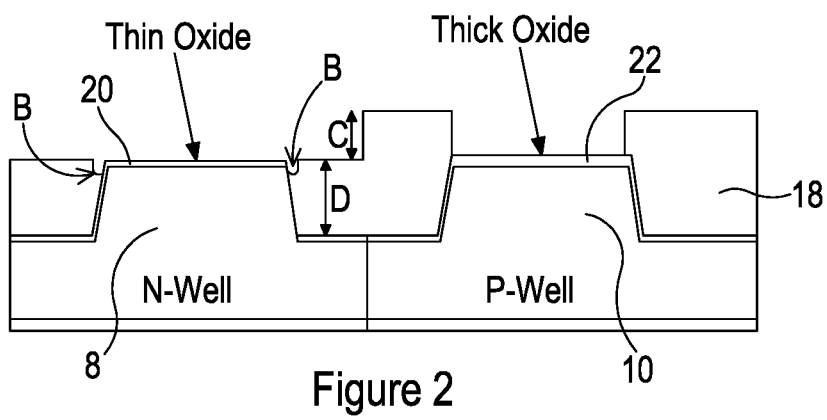
FIG. 2 shows a subsequent step in the prior art process after the thick oxide layer has been removed from unnecessary areas.
Figure 3:
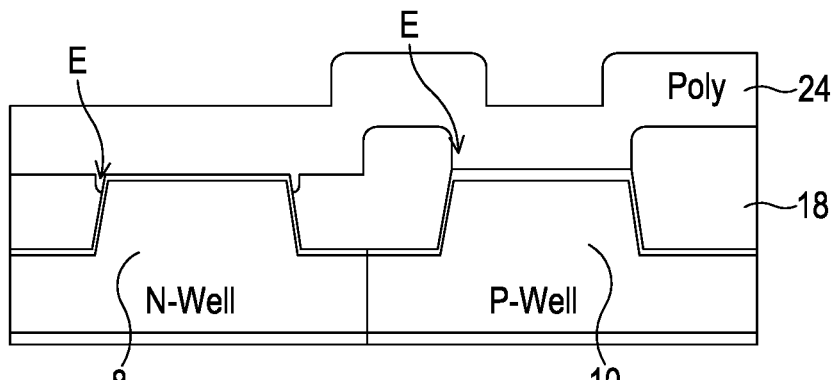
FIG. 3 shows a subsequent step in the prior art process after Gate Poly deposition.

FIGS. 1 to 3 show steps in a prior art process.

FIG. 1 shows a substrate 2 on which two gates 8 and 10 are formed with a trench 4 therebetween. The substrate 2 is coated with an oxide layer 6, on top of which SiN Hardmasks (SIN HMs) 14 and 16 are formed above the two gates 8 and 10 respectively. The trench 4 is filled with Shallow Trench Isolation (STI) material 18, as are the regions outside the gates 8 and 10.

FIG. 1 shows the device after Chemical Mechanical Polishing (CMP) of the Shallow Trench Isolation (STI) material 18, and after oxide etching to achieve the required STI field step height [A] for subsequent processing. In the prior art, this height [A] can range from 600 A to 1400 A, translating to an initial SiN Hardmask (SIN HM) deposition thickness of 1100 A to 2100 A. In this specification the unit of angstrom, being 0.1 nanometers, is abbreviated simply by the letter A. This range is suitable for a simple dual-Gate logic-only integration to a comprehensive parts integration for System-on-Chip (SoC) solutions. The method described herein can reduce the required field step height [A] to between 200 A and 300 A, and can reduce the initial SiN HM deposition thickness to between 600 A and 700 A.

FIG. 2 shows a subsequent step in the prior art process after the formation of a thin oxide region 20 on gate 8, and a thick oxide region 22 on gate 10, just prior to a step of Gate Poly deposition (shown in FIG. 3). The thick oxide 22 is grown first and then removed from unnecessary areas.

This process results in the formation of a divot [B] (i.e. a recess in the STI material 18) at each side of the thin oxide gate 8, as shown in FIG. 2. In addition this process results in the formation of an STI step height difference [C] and a reduced STI depth [D] as shown in FIG. 2. In the prior art, the depth of the STI divot [B] can range from 100 A to 300 A. The method described herein eliminates the STI divot [B]. In the prior art, the STI field step height difference [C] can range from 200 A to 300 A. In the prior art, STI field oxide loss can reduce the STI depth [D] to 200 A below the thin oxide region 20 on the silicon surface. The method described herein can maintain the STI depth [D] at a desired 200 A above the thin oxide region 20, regardless of different parts integration.

FIG. 3 shows the prior art process after the deposition of polysilicon 24 above the oxide layers 20 and 22. In the prior art, sharp Gate/Poly edges [E] are created at the edges of the gates 8 and 10 due to the STI divots [B] and the STI step height difference [C] respectively. The method described herein eliminates the formation of the sharp edges [E].

We now describe a method which may involve using self-aligned polysilicon capping on the STI region.

Figure 4:
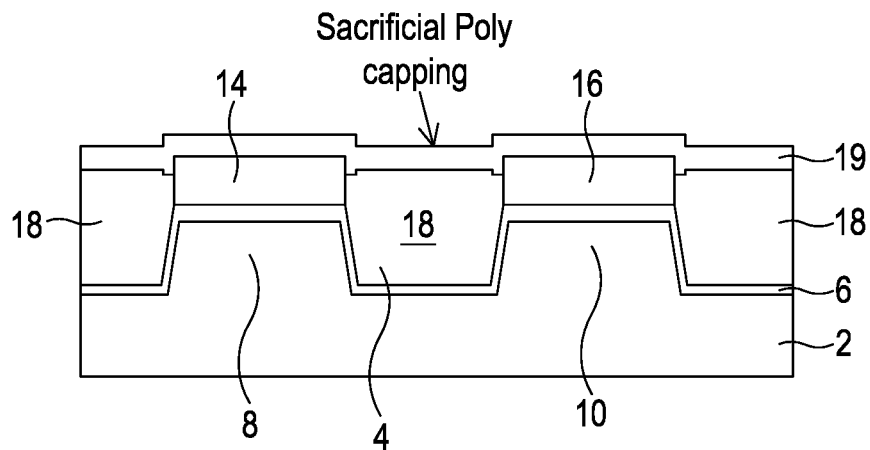
FIG. 4 shows the first stage in an improved method in the fabrication of a device in which a sacrificial polysilicon layer is used.

FIG. 4 shows the first step in an improved method. In FIG. 4, items corresponding to those in FIG. 1 are shown using the same reference numerals. As shown in FIG. 4, after the prior art step shown in FIG. 1, a sacrificial layer 19 of polysilicon is deposited on top of the STI material 18 and the SiN Hardmasks (SIN HMs) 14 and 16. The sacrificial poly layer 19 is self-aligned (i.e. layer 19 is deposited to cover the STI region 18 without the use of photolithography masking and related processing to define the boundaries, and is self-aligned with respect to the SIN HMs 14 and 16), and is deposited immediately after chemical mechanical planarization (CMP) of the STI HDP (High Density Plasma) oxide 18.

Figure 5:
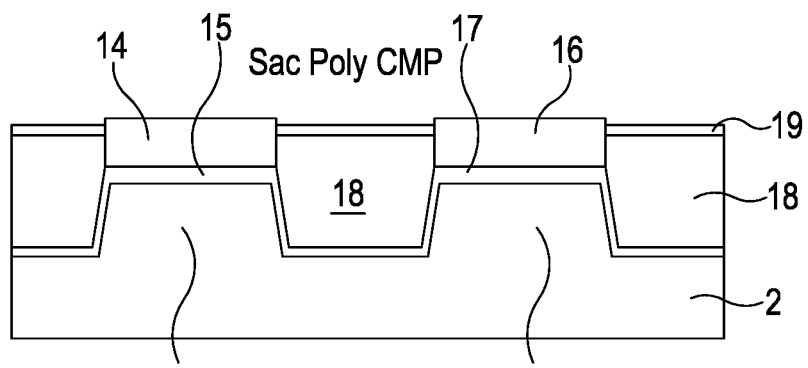
FIG. 5 shows a subsequent state in the method after some of the sacrificial polysilicon layer is removed by CMP.

FIG. 5 shows a stage in the method after some of the sacrificial poly layer 19 has been removed from the active region (i.e. gate regions 8 and 10) by Poly CMP, using the SiN Hardmasks 14 and 16 as a stopping layer.

Figure 6:
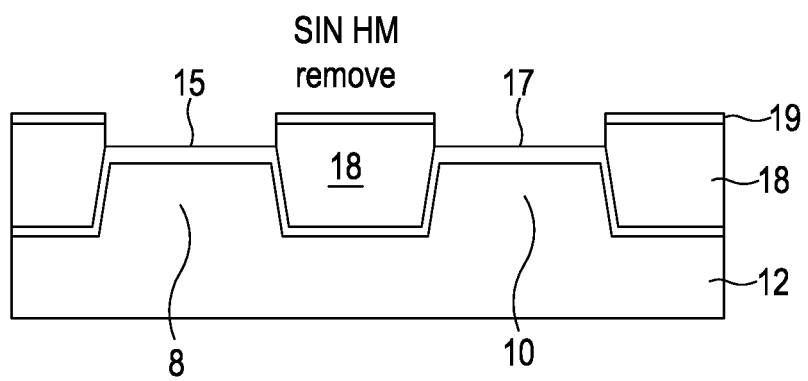
FIG. 6 shows the device after removal of SiN Hardmasks.

FIG. 6 shows sacrificial poly layer 19 capping the STI material 18, after the SiN Hardmasks 14 and 16 have been removed. The SiN Hardmasks 14 and 16 are removed using a wet phosphoric etch, followed by Pad oxide removal using wet etching (e.g. a HF wet etch). "Pad oxide" refers to the oxide layer (initially) located below the SiN hardmasks (i.e. in the gate regions 8 and 10). (Removal of the pad oxides 15 and 17, on the gate regions 8 and 10 respectively, is not shown in FIG. 6.) Oxide loss in the STI field regions 18 is now prevented due to the sacrificial poly layer 19 capping on the STI field region 18. That is, the surface level of the STI material (as defined by [A] or [D]) is unchanged or substantially unchanged after removing the pad oxide layer.

Figure 7:
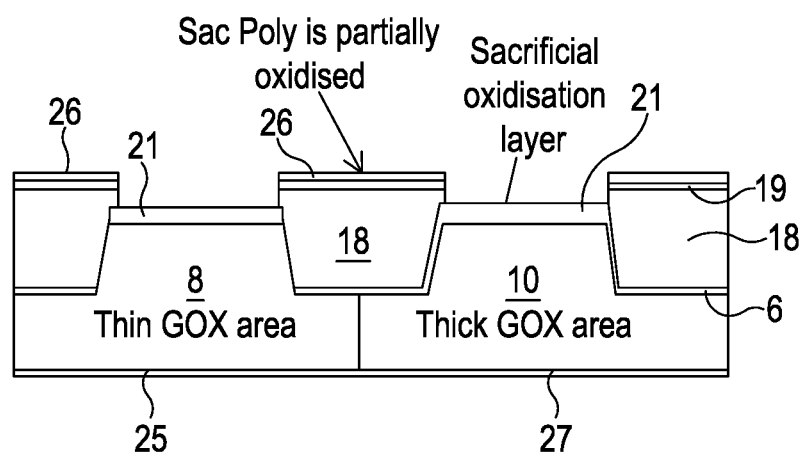
FIG. 7 shows the device after a sacrificial oxide layer has been grown.

FIG. 7 shows a subsequent step of the method in which a sacrificial oxide layer 21 is grown prior to well implantations (i.e. before doping). During the well implantation process gate region 8 is covered by photo resist and ion dopants are implanted into gate region 10 using an implanter tool to form the thick GOX device well. The process is repeated by covering gate region 10 by photo resist and implanting gate region 8. The sacrificial poly layer 19 is partially oxidized (i.e. forming an oxidized poly layer 26) during the growth of the sacrificial oxide layer.

After well implantations, the sacrificial oxide layer 21 is removed by HF wet etch. Oxide loss in the STI field region 18 once again is prevented by the remaining Sacrificial Poly layer 19.

Figure 8:
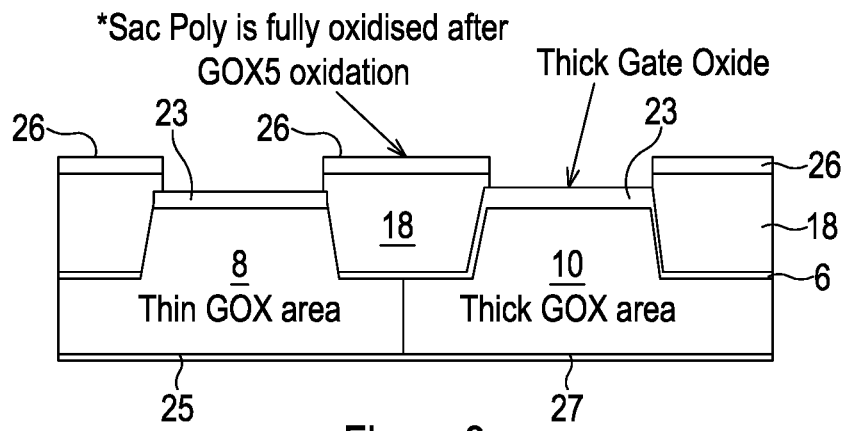
FIG. 8 shows the device after a thick oxide layer is grown, and the sacrificial poly layer is fully oxidized.

FIG. 8 shows the next step in which a thick Gate oxide 23 is grown on gates 8 and 10. The remaining sacrificial poly layer 19 is fully oxidized during this thick Gate oxide 23 oxidation process. That is, oxidized poly layer 26 covers the STI material 18.

The device can be considered as divided into a thin GOX (Gate Oxide) region 25 and a thick GOX (Gate Oxide) region 27, as shown in FIG. 8. The thin GOX region 25 includes the gate 8 and part of the trench 4. The thick GOX region 27 includes the gate 10 and the remaining part of the trench 4, as shown in FIG. 8.

Figure 9:
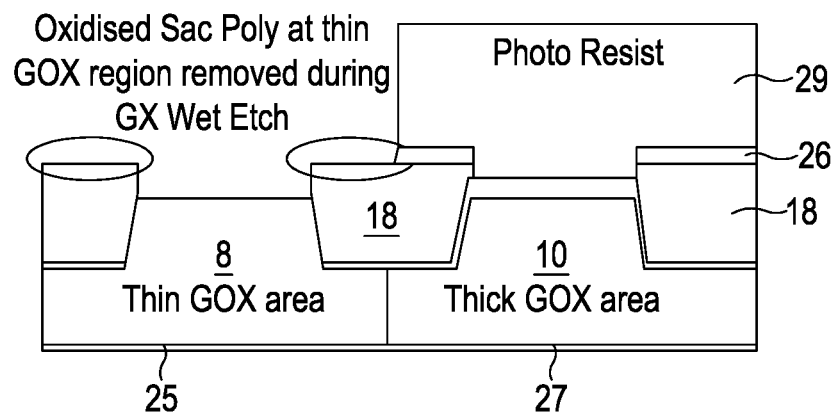
FIG. 9 shows the device after removal of the thick oxide layer from a gate area, and after removal of the oxidized sacrificial poly layer using a wet etch.

FIG. 9 shows a stage in the method after the thick oxide 23 has been removed (e.g. by HF wet etch) from the thin GOX region 25. This is achieved by covering the thick GOX region 27 by photoresist 29 which has been exposed and selectively removed. Using a HF Wet Etch, the oxidized sacrificial poly layer 26 is removed from the STI field area 18 of the thin GOX region 25. Very little STI field oxide 18 is lost during this process.

Figure 10:
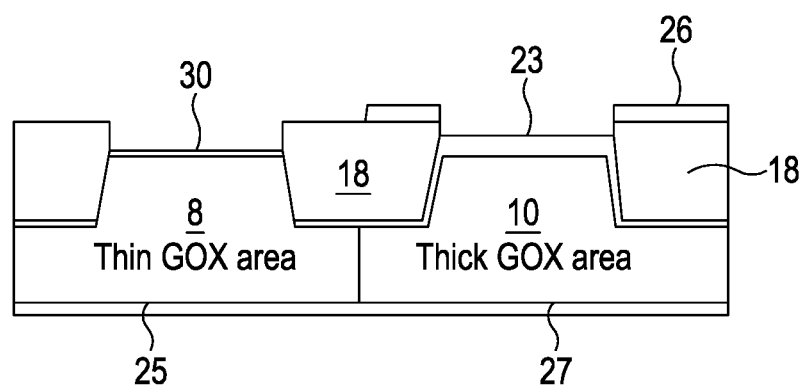
FIG. 10 shows the device after a thin oxide layer has been grown in a gate area.

FIG. 10 shows a stage in the method after a thin oxide 30 has been grown in the thin GOX region 25, and the photoresist 29 has been removed from the thick GOX region 27.

The thick oxide 23 and the thin oxide 30 may be thermal oxides, grown by a furnace process. Alternatively, the thin oxide 30 may be an In-Situ Steam Generation (ISSG) oxide. The thickness of the thick oxide 30 is typically within the range of 60 A to 180 A, to operate at a supply voltage ($V_{dd}$) of about 3 V to 5.5 V. The thickness of the thin oxide 30 is typically within the range of 18 A to 32 A, to operate at about 1.0 V to 1.8 V $V_{dd}$.

The method described is advantageous in semiconductor device FEOL, where the method may be used after chemical mechanical planarization (CMP) on an STI HDP oxide.

The fabrication process may involve a 5V device with a thick oxide and a 1.5V device with a thin gate oxide. The variation of step height will be huge and is a challenge for the device robustness.

The method can be used, for example, in manufacturing silicon wafers with analog applications that can be integrated with additional functions such as high voltage, non-volatile memory or sensors.

Although the above described certain embodiment provides a sequence of steps in a specific order, the skilled person will appreciate that not all of these steps have to be performed sequentially in the order presented. That is, the order of some steps may be changed without departing from the scope of the invention.

Each feature disclosed or illustrated in the present specification may be incorporated in the invention, whether alone or in any appropriate combination with any other feature disclosed or illustrated herein.

What is claimed is:

1. A method of fabricating a semiconductor device with Shallow Trench Isolation (STI), said method comprising performing the following steps in the following order:

providing a substrate comprising first and second gate regions separated by a trench formed in said substrate, wherein said trench is filled with an STI material;

depositing a sacrificial polysilicon layer covering and in direct contact with the STI material;

growing a thick oxide layer directly on said substrate in said first and second gate regions, whilst growing said thick oxide layer, oxidizing said sacrificial polysilicon layer to form an oxidized sacrificial polysilicon layer;

removing said thick oxide layer from said first gate region to expose said substrate in said first region while leaving said thick oxide layer in said second gate region, wherein said step of removing said thick oxide layer also comprises removing said oxidized sacrificial polysilicon layer so as to at least partly expose said STI material.

2. A method as claimed in claim 1, which further comprises, after said step of removing said thick oxide layer, growing a thin oxide layer on said first gate region.

3. A method as claimed in claim 1, which further comprises providing silicon nitride (SiN) hardmasks on said first and second gate regions prior to said step of depositing a sacrificial polysilicon layer.

4. A method according to claim 3, wherein said SiN hardmasks have a thickness in the range of 600 to 700 angstrom.

5. A method as claimed in claim 3, which further comprises:
removing said sacrificial polysilicon layer from said first and second gate regions by chemical mechanical planarization using said SiN hardmasks as stopping layers.

6. A method as claimed in claim 3, which further comprises removing said SiN hardmasks.

7. A method as claimed in claim 3, wherein said SiN hardmasks are removed using a wet phosphoric etch.

8. A method as claimed in claim 6, wherein said step of removing said SiN hardmasks does not substantially change the surface level of said STI material.

9. A method as claimed in claim 6, which further comprises, after removing said SiN hardmasks, removing a pad oxide layer on said first and second gate regions.

10. A method as claimed in claim 9, wherein said pad oxide layer is removed using wet etching.

11. A method as claimed in claim 9, wherein said step of removing said pad oxide layer does not substantially change the surface level of said STI material.

12. A method as claimed in claim 1, which further comprises:
before said step of growing said thick oxide layer, growing a sacrificial oxidisation layer on said first and second gate regions, which partially oxidises said sacrificial polysilicon layer;
implanting one or more dopants in said first and second gate regions; and
removing said sacrificial oxide layer after said step of implanting.

13. A method as claimed in claim 12, wherein said sacrificial oxide layer is removed using wet etching.

14. A method as claimed in claim 12, wherein said step of removing said sacrificial oxide layer does not substantially change the surface level of said STI material.

15. A method as claimed in claim 1, wherein said substrate is divided into:
a first area which includes said first gate region and a first part of said trench; and
a second area which includes said second gate region and a second part of said trench;
and wherein said step of removing said thick oxide layer from said first gate region comprises:
depositing a photoresist layer covering said first and second areas;
exposing said photoresist layer; and
removing said photoresist layer from said first area.

16. A method as claimed in claim 15, wherein said first and second parts of said trench together form the whole of said trench.

17. A method as claimed in claim 15, wherein said thick oxide layer is removed from said first gate region using wet etching.

18. A method as claimed in claim 15, wherein said step of removing said thick oxide layer from said first gate region does not substantially change the surface level of said STI material in said first area.

19. A method as claimed in claim 15, wherein said step of removing said oxidized sacrificial polysilicon layer comprises removing said oxidized sacrificial polysilicon layer from said first area.

20. A semiconductor device with Shallow Trench Isolation (STI) fabricated by the method of claim 1.

* * * * *